(12) United States Patent
Frye (10) Patent No.: US 9,653,768 B2
(45) Date of Patent: May 16, 2017

(54) COUPLING OF SIGNALS ON MULTI-LAYER SUBSTRATES

(71) Applicant: Blue Danube Systems, Inc., Warren, NJ (US)

(72) Inventor: Robert C. Frye, Piscataway, NJ (US)

(73) Assignee: Blue Danube Systems, Inc., Warren, NJ (US)

( * ) Notice: Subject to any disclaimer, the term of this patent is extended or adjusted under 35 U.S.C. 154(b) by 0 days.

(21) Appl. No.: 14/745,710

(22) Filed: Jun. 22, 2015

(65) Prior Publication Data

US 2015/0372366 A1 Dec. 24, 2015

Related U.S. Application Data

(60) Provisional application No. 62/015,604, filed on Jun. 23, 2014.

(51) Int. Cl.
| | |
|---|---|
| *H01P 5/02* | (2006.01) |
| *H01P 3/08* | (2006.01) |
| *H01P 3/02* | (2006.01) |
| *H05K 1/02* | (2006.01) |
| *H01P 5/12* | (2006.01) |

(52) U.S. Cl.
CPC ............. *H01P 3/081* (2013.01); *H01P 3/02* (2013.01); *H01P 3/026* (2013.01); *H01P 5/028* (2013.01); *H05K 1/0228* (2013.01); *H05K 1/0242* (2013.01)

(58) Field of Classification Search
CPC ................. H01P 3/08; H01P 5/02; H01P 5/18
USPC ............................ 333/24 R, 1, 238, 109, 116
See application file for complete search history.

(56) References Cited

U.S. PATENT DOCUMENTS

| | | | | |
|---|---|---|---|---|
| 5,638,402 | A * | 6/1997 | Osaka | ................. H04L 25/0266 375/219 |
| 6,600,790 | B1 * | 7/2003 | Umemura | ........... G06F 13/4072 375/257 |
| 6,703,907 | B1 | 3/2004 | Van der Wagt | |
| 6,978,328 | B1 * | 12/2005 | Osaka | ................. H05K 1/0228 365/52 |
| 7,002,430 | B2 * | 2/2006 | Benham | .............. G06F 13/4086 333/116 |

(Continued)

FOREIGN PATENT DOCUMENTS

| | | |
|---|---|---|
| EP | 2068391 | 6/2009 |
| WO | 95/06955 | 3/1995 |

(Continued)

*Primary Examiner* — Dean Takaoka
(74) *Attorney, Agent, or Firm* — Occhiuti & Rohlicek LLP (57) ABSTRACT

A signal distribution structure including: a dielectric material; an overlying conducting layer on a first level of the dielectric material; a first signal line on a second level of the dielectric material, the first signal line being physically separated from the overlying conducting layer by the dielectric material; wherein the overlying conducting layer includes a window running parallel to the first signal line, and further comprising within the window a first coupler electrode on the first level of the dielectric material, the first coupler electrode above, parallel to, and electrically isolated by the dielectric material from the first signal line, wherein the first coupler electrode is electrically isolated from the overlying conducting layer along at least most of its periphery.

25 Claims, 4 Drawing Sheets

(56) References Cited

U.S. PATENT DOCUMENTS

| | | | | |
|---|---|---|---|---|
| 7,170,361 | B1 * | 1/2007 | Farnworth | H01L 23/66 257/778 |
| 7,307,492 | B2 * | 12/2007 | Tripathi | H05K 1/0239 333/111 |
| 7,475,179 | B2 * | 1/2009 | Osaka | G06F 13/4086 333/109 |
| 7,567,146 | B2 * | 7/2009 | Tervo | H01P 5/185 333/109 |
| 7,911,290 | B2 * | 3/2011 | Vimercati | H04B 3/56 333/12 |
| 9,147,925 | B2 * | 9/2015 | Dremelj | H01P 5/187 |
| 2002/0057136 | A1 | 5/2002 | Marketkar et al. | |
| 2004/0103383 | A1 | 5/2004 | Tripathi et al. | |

FOREIGN PATENT DOCUMENTS

| | | |
|---|---|---|
| WO | 2005/093896 | 10/2005 |
| WO | 2007/099202 | 9/2007 |

\* cited by examiner

COUPLING OF SIGNALS ON MULTI-LAYER SUBSTRATES

This application claims the benefit under 35 U.S.C. §119 (e) of Provisional Application Ser. No. 62/015,604 filed Jun. 23, 2014, entitled "Method for Transmission and Coupling of Signals on Multi-Layer Boards with Minimum Interference," the entire contents of which are incorporated herein by reference.

TECHNICAL FIELD

The described inventions generally relate to high frequency signal distribution on Printed Circuits Boards (PCBs) and other multi-layer substrates and to line tapping via couplers.

BACKGROUND OF THE INVENTION

High frequency signal transmission is most commonly point-to-point. Power is generated at a source (the transmitter), and delivered to a load (the receiver) via a transmission line. In such cases, the receiver usually includes a terminating resistance that is equal to the characteristic impedance of the transmission line. The transmitted signal power is dissipated in this resistance, and no signal reflection occurs from the receiver.

In some applications, it is desirable to transmit a signal from a single transmitter to multiple receivers arranged sequentially along the line. In such cases, each of the receivers necessarily receives only a fraction of the transmitted power, since it is shared among all of the receivers. Furthermore, the signal at each receiver arrives with a unique delay with respect to the transmitter, determined by the receiver's location. Impedance discontinuities in the signal transmission path are undesirable in this case, since they give rise to reflections that interfere with the original transmitted signal. In such arrangements, a simple terminating resistance alone is not sufficient to guarantee the integrity of the signal. In addition, a means is necessary to couple a fraction of the transmitted signal power to each of the receivers that are arranged along the line. A necessary requirement for these couplers is that they must not create local impedance discontinuities that would cause signal reflections.

A converse situation also occurs in which multiple transmitters are arranged serially along the transmission line, connected to a common receiver at the line's end. In this case, it is desired to aggregate the signal power of all of the transmitters at the receiver. Similar to the above case, the various signals each have a unique delay determined by the transmitter's location with respect to the receiver. Also as in the above case, signal reflections are a source of interference. The requirements for the structures that couple signal power between the transmitters and the transmission line are the same as in the above case.

More generally, distribution networks like the ones described above may be combined using active circuitry such that in some modes of operation the circuit at the end of the line transmits to multiple receivers arranged serially along the line, and in other modes the circuit at the end of the line receives signals from multiple transmitters arranged serially along the line.

SUMMARY

The embodiments described herein employ a method for distributing signals in planar technologies such as PCBs. One or more couplers is provided to electrically couple signals from the transmission line to transmitters or receivers arranged along the line without causing appreciable signal reflection to occur.

In general, in one aspect, the invention features a signal distribution structure including: a dielectric material; an overlying conducting layer on a first level of the dielectric material; a first signal line on a second level of the dielectric material, the first signal line being physically separated from the overlying conducting layer by the dielectric material; wherein the overlying conducting layer includes a window running parallel to the first signal line, and further including within the window a first coupler electrode on the first level of the dielectric material, the first coupler electrode above, parallel to, and electrically isolated by the dielectric material from the first signal line, wherein the first coupler electrode is electrically isolated from the overlying conducting layer along at least most of its periphery.

In general, in another aspect, the invention features a signal distribution structure including: a dielectric material; an overlying conducting layer on a first level of the dielectric material; first and second parallel signal lines on a second level of the dielectric material, the first and second signal lines being physically separated from the overlying conducting layer by the dielectric material; wherein the overlying conducting layer includes a window running parallel to the first and second signal lines, and further comprising within the window a first coupler electrode and a second coupler electrode on the first level of the dielectric material, the first coupler electrode above, parallel to, and electrically isolated by the dielectric material from the first signal line and the second coupler electrode above, parallel to, and electrically isolated by the dielectric material from the second signal line, wherein each of the first and second coupler electrodes is electrically isolated from the overlying conducting layer along at least most of its periphery.

Other embodiments have one or more of the following features. The signal distribution structure further includes an underlying conducting layer on a third level of the dielectric material, wherein the second level of the dielectric material is between the first and third levels of the dielectric material. Each of the first and second coupler electrodes are islands of metal physically separated from each other and physically separated from the overlying conducting layer. The signal distribution structure also includes a first resistive element electrically connecting one end of the first coupler electrode to the overlying conducting layer and a second resistive element electrically connecting one end of the second coupler electrode to the overlying conducting layer. Each of the first and second coupler electrodes physically contacts the overlying conducting layer at one end. The first coupler electrode includes a contact pad area for electrically connecting to the first coupler electrode and the second coupler electrode includes a contact pad area for electrically connecting to the second coupler electrode. The contact pad areas on the first and second coupler electrodes are located at one end of the first and second coupler electrodes, respectively. The first and second coupler electrodes are equidistant from the first and third levels on which the overlying and underlying conductive layers, respectively, are located. The signal distribution structure also includes a plurality of electrically conducting vias passing through the dielectric material and electrically connecting the overlying and underlying conducting layers together. The first signal line that is beneath the first coupler electrode is of a different width as compared to the portion of first signal line that is beneath the overlying conducting layer and the portion of the second signal line that is beneath the second coupler electrode is of a different width as compared to the portion of second signal line that is beneath the overlying conducting layer. The dielectric material and the overlying and underlying conducting layers are fabricated using printed circuit board technology. The first and second signal lines in combination with the overlying and underlying conducting layers form a shielded, differential transmission line.

In general, in yet another aspect the invention features a signal distribution system including a transmission line having a sequence of coupler structures of the type described above arranged sequentially along the transmission line from a first end to a second end.

Other embodiments may include one or more of the following features. The transmission line includes: a dielectric material; an overlying conducting layer on a first level of the dielectric material; first and second parallel signal lines on a second level within the dielectric material, the first and second signal lines being physically separated from the overlying conducting layer by the dielectric material. Each coupler structure includes: a window in the overlying conducting layer running parallel to the first and second signal lines; and within the window a first coupler electrode and a second coupler electrode on the first level of the dielectric material, the first coupler electrode parallel to and electrically isolated by the dielectric material from the first coupling line and the second coupler electrode parallel to and electrically isolated by the dielectric material from the second coupling line, wherein each of the first and second coupler electrodes is electrically isolated from the overlying conducting layer along at least most of its periphery.

Still other embodiments may include one or more of the following features. The signal distribution system also includes an underlying conducting layer on a third level of the dielectric material, wherein the second level of the dielectric material is between the first and third levels of the dielectric material. The coupler electrodes of each successive coupler structure of the plurality of coupler structures are longer than the coupler electrodes of the previous coupler structure in the sequence of coupler structures. Within each coupler structure of the sequence of coupler structures, each of the first and second coupler electrodes are islands of metal physically separated from each other and physically separated from the overlying conducting layer in which case each coupler structure of the sequence of coupler structures may further include a first resistive element electrically connecting one end of the first coupler electrode of that coupler structure to the overlying conducting layer and a second resistive element electrically connecting one end of the second coupler electrode of that coupler structure to the overlying conducting layer. Within each coupler structure of the sequence of coupler structures, each of the first and second coupler electrodes of that coupler structure physically contacts the overlying conducting layer at one end.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
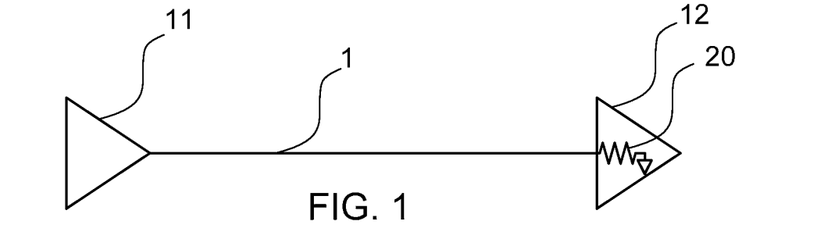
FIG. 1 shows a schematic diagram of a simple point-to-point signal interconnection.

FIG. 1 shows a schematic diagram of a common circuit for point-to-point signal transmission. This simple arrangement includes a transmitter 11, a receiver 12, and a transmission line 1. The physical transmission line typically consists of an electrically conducting pathway (for example, a wire) facilitating current flow from the transmitter's output to the receiver's input, and a second conducting pathway to allow for an opposing current to return from the receiver to the transmitter. In systems including more than one such pathway, the return pathway is sometimes shared by multiple transmission lines, in which case the transmission line is often referred to as "single ended". In other such systems, each of the transmission line is provided with a unique return pathway, in which case the transmission line is often referred to as "differential".

The various frequency elements of the transmitted signal propagate as waves along the transmission line. For the higher frequency elements in particular, the physical length of the transmission line may be an appreciable fraction of the wavelength of that element. In such cases, the integrity of the received signal may be degraded by the presence of reflected signals on the transmission line. To maintain signal integrity, it is common practice to provide a terminating resistance 20 at the receiver. If the value of this terminating resistance matches the characteristic impedance of the transmission line, then the signal power is dissipated in the resistance and no signal reflection occurs.

Figure 2:
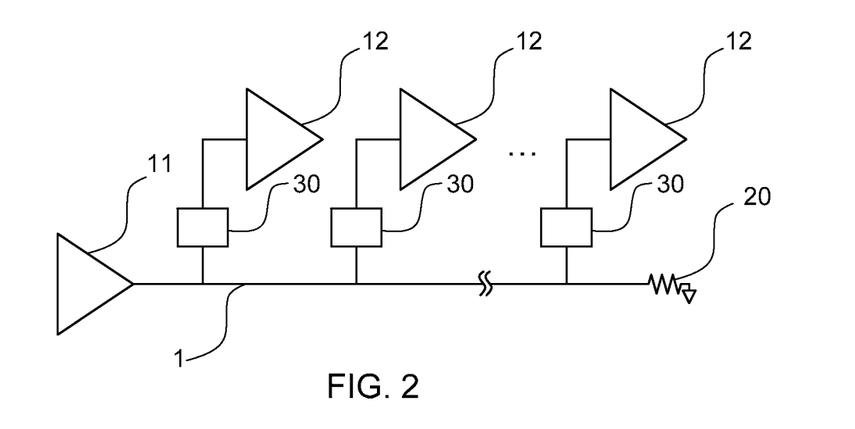
FIG. 2 shows a schematic diagram of signal distribution from a common transmitter to multiple receivers arranged serially along a transmission line.

In some applications, it is desirable to transmit a signal to multiple receivers arranged along the transmission line, as shown in FIG. 2. In such an arrangement, the receivers share the total transmitted power, so each receives only a fraction of the transmitted power. To facilitate this arrangement, it is advantageous to provide a coupler 30 for coupling the signal from the transmission line to each receiver. In addition to controlling the signal coupling between the transmission line and the receiver, the coupler 30 should not cause an appreciable local change in the characteristic impedance of the transmission line, since this would cause an undesirable signal reflection that would degrade the integrity of the received signals. Also, in the usual event that some of the signal power is not distributed to the receivers, a resistance 20 is provided at the termination of the transmission line to avoid reflection of the power at that point.

Figure 3:
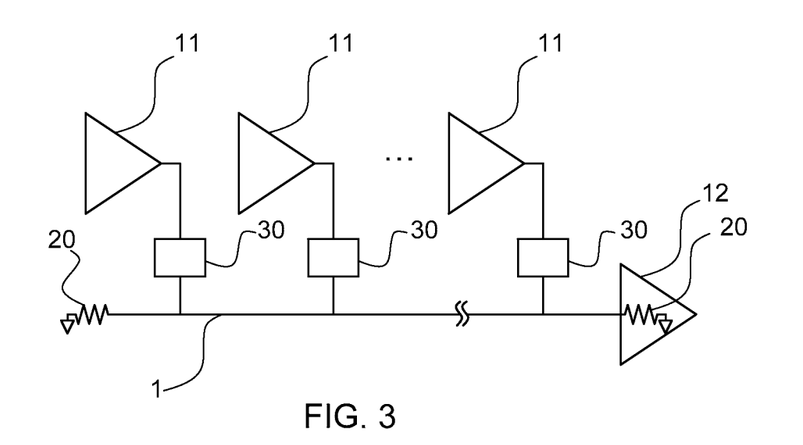
FIG. 3 shows a schematic diagram of signal distribution from multiple transmitters arranged serially along a transmission line a common receiver.

FIG. 3 shows the converse situation in which multiple transmitters arranged along the line deliver signal power to a common receiver. A similar coupler structure may be used in this arrangement. As in the above case, it is similarly desirable for the coupler to introduce negligible local changes in the transmission line's characteristic impedance.

Figure 4:
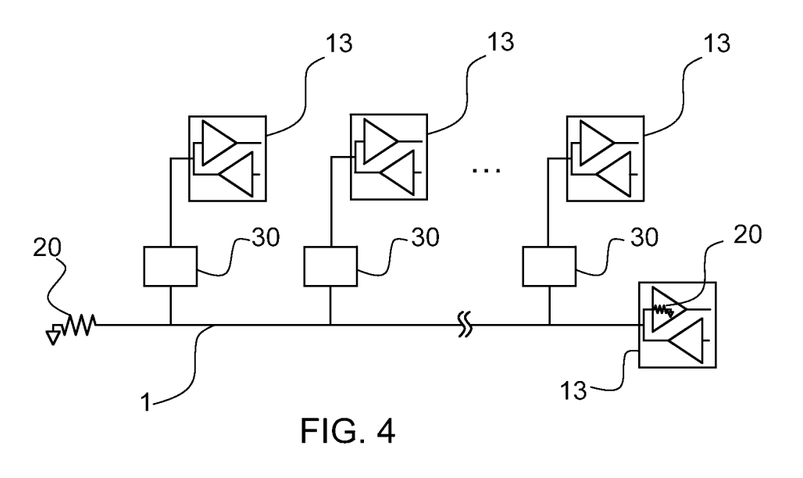
FIG. 4 shows a schematic diagram of a general bi-modal serial signal distribution network.

A generalization of these arrangements is shown in FIG. 4, in which bi-modal transmitter-receiver circuits 13 are used. With this type of arrangement, multiple receivers or transmitters may share common transmitters or receivers, respectively, depending on the chosen operating mode of the active circuitry. The same design considerations for the coupling structures apply in either mode.

Low-Reflection, Compact, Broadband Differential Couplers

In addition to the signal lines themselves, a critical structure in the serial distribution network shown in FIG. 4 is the coupler 30. To maintain good signal integrity, a desirable property of the couplers is that they introduce minimal signal reflections in the distributing transmission line. This requires the characteristic impedance of the main transmission line to be unperturbed by the presence of the coupler. Meeting this criterion is complicated by the manufacturing variations that typically exist in most planar technologies. These variations lead to variations in the characteristic impedance of the transmission lines. Consequently, it is desirable to devise coupling structures in which manufacturing variations affecting the transmission lines also affect the couplers in a similar fashion, so that the signal reflections are minimized regardless of the variations.

Directional couplers are commonly used in microwave systems to divert a portion of the signal energy from a primary signal transmission line onto another secondary line without causing appreciable signal reflection. In planar technologies, directional couplers are usually formed by a pair of transmission lines whose lengths are equal to one-quarter of the signal wavelength in the transmission line at the desired center operating frequency. The two lines are placed in proximity, resulting in electromagnetic coupling between them. With appropriate choice of structure dimensions, it is possible to realize couplers with desired properties of coupling strength and characteristic impedance. In addition, these structures exhibit the property of directivity, in which the signal that is coupled from one line to the other preferentially flows in one direction. Sophisticated couplers intended to exhibit coupling strength and directivity over a wide frequency range are made by cascading multiple quarter-wavelength sections of coupled line.

When implemented in the same planar structure as the lines to which they connect, these conventional directional couplers exhibit the desired property of insensitivity to manufacturing variations described above. The structure of the coupled transmission lines in the coupler is usually similar to the structure of the main transmission lines to which the coupler connects. Consequently, structural and material variations that affect the characteristic impedance of the transmission lines typically have a similar effect on the characteristic impedance of the coupler. A disadvantage of these types of coupler in some applications is their large physical size.

The embodiments described below can be used in applications requiring compact structures. In such cases, it is possible to obtain suitable coupling over a wide frequency range in a more compact structure that is substantially shorter than one quarter of the signal wavelength.

Figure 5:
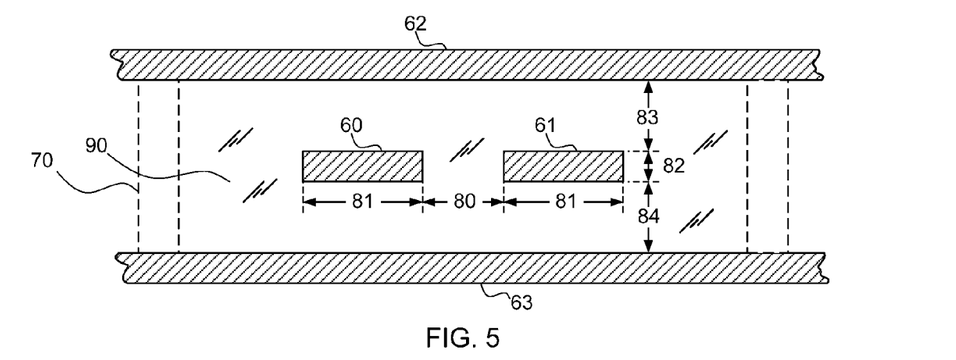
FIG. 5 shows a cross-section of a typical structure used to implement a uniform shielded differential transmission line in a multi-layer planar technology.

FIG. 5 shows a cross-section of a typical structure used to implement a uniform, shielded differential transmission line in a multilayer planar technology such as a PCB. In the structure, the differential pair of signal lines 60 and 61 are formed in a layer of metal with an overlying layer 62, and an underlying layer 63 forming a surrounding shielding structure. These shielding layers are usually connected electrically by vertical conducting vias 70 placed at intervals along the length of the lines normal to the cross-section. The electrical potential of the surrounding shield structure is typically taken as a reference ("ground") and the electrical potential on the differential signal lines varies symmetrically with respect to this reference, with equal amplitude and opposing sign. The region between the metal planes is filled by a dielectric 90.

In a differential transmission line, the widths 81 of the two signal lines 60 and 61 are identical. The differential characteristic impedance is determined by the line width 81 and spacing 80, as well as the vertical dimensions 82, 83 and 84 of the structure.

Line widths and spacings are usually comparable to the dielectric thickness. For example, in the described embodiment, the thickness of each dielectric layer is 250-micron (0.25 mm), the line width is 200 micron, and the spacing is 250.

Figure 6:
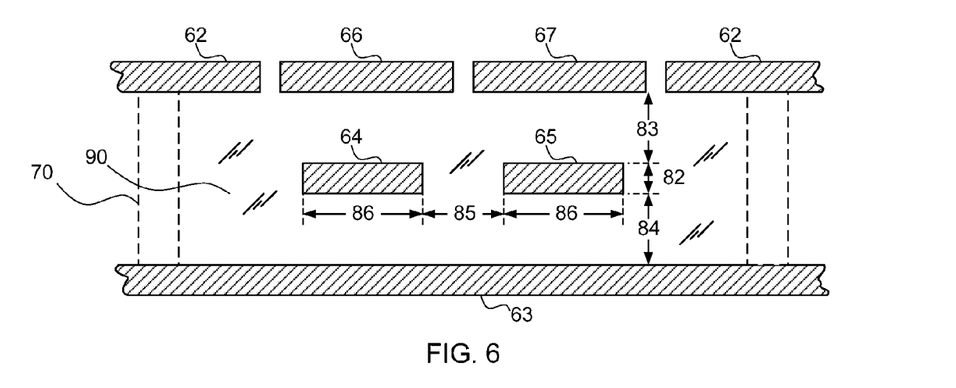
FIG. 6 shows a coupler structure for use in connection with the transmission lines shown in FIG. 8.

The coupler structure is shown in cross-section in FIG. 6. The signal lines 64 and 65 within the coupler connect directly to the signal lines 60 and 61, respectively, in the transmission line outside the coupler region, but their dimensions 85 and 86 may be different. The coupler electrodes 66 and 67, having the same widths, are formed in the outer shield 62. These electrodes extend for some desired length along the lines. In operation, a signal passing along the differential transmission line 64 and 65 will induce a differential voltage and/or current in the coupler electrodes 66 and 67, respectively. The coupled signal strength is determined, in part, by the length of the electrodes.

It can be seen from inspection of FIG. 5 and FIG. 6 that the structure of the signal lines in the two is similar. Based on electromagnetic simulation and analysis, dimensions for the lines in the coupler, 85 and 86, can be chosen such that the characteristic impedance of the lines in the coupler are a close match to the lines outside the coupler, thereby minimizing signal reflections at the junction between the two. If the induced voltage on the coupler electrodes is small relative to the voltage on the signal lines, then the field distribution surrounding the transmission line is not greatly perturbed by the presence of the electrodes, because their potential is not greatly different from that of the shield. In that case, the signal line widths within and external to the coupler, 86 and 81, will be similar, as will the spaces 85 and 80.

In the case that the dimensions of the lines within the coupler and external to the coupler are adjusted to result in similar characteristic impedances, and the dimensions of the lines are similar in the two cases, structural and material variations in manufacturing that affect the characteristic impedance of one have a similar effect on the other. In such cases, when the couplers are used in serial distribution networks like the ones described above, they will not significantly degrade the signal integrity through the introduction of signal reflections. Moreover, manufacturing variations that cause the characteristic impedance of the transmission lines to change will cause similar variations in the coupler structure so that the signal integrity is maintained.

Figure 7:
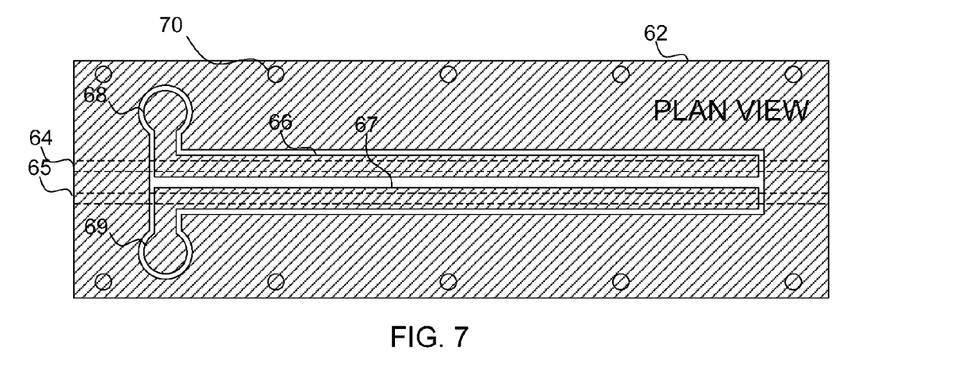
FIG. 7 shows a plan view of a capacitive type coupler.

Coupler structures of this type can be configured in three different ways. FIG. 7 shows a plan view of a capacitive type coupler. In this figure, the coupler electrodes 66 and 67 are electrically isolated from the surrounding shield (ground) 62 as indicated by an open area (metal-free region) surrounding the islands of metal film representing the coupler electrodes. The signal lines 64 and 65 pass beneath the coupler electrodes. Contact areas 68 and 69 are provided off to the side to allow connection of the coupler to external circuits. Couplers of this type are predominantly capacitive, because voltages are induced in the coupler electrodes but little current can flow. When connected to high impedance sensing circuitry, these couplers have relatively constant voltage gain characteristics over a wide frequency range. Voltage gain is adjusted by changing the length of the coupler electrode.

Figure 8:
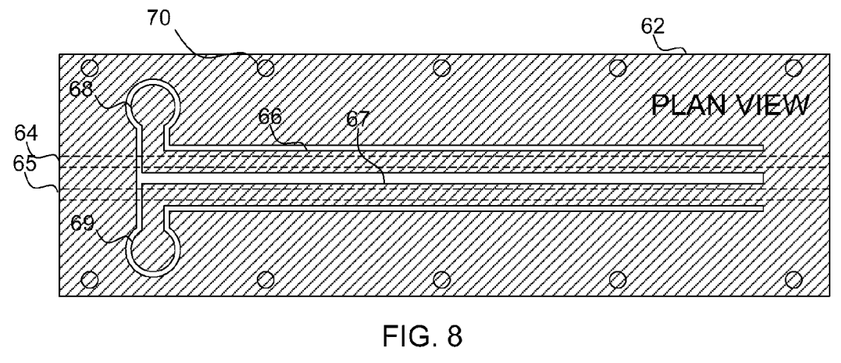
FIG. 8 shows a plan view of an inductive type coupler.

A plan view of a similar inductive coupler is shown in FIG. 8. It has the same structural features as its capacitive counterpart. The only structural difference is that the electrodes at the right-hand side of the figure (i.e., the end opposite from the end with the contact pads) are connected to the ground plane 62. This coupler type is predominantly inductive because currents are induced in the coupler electrodes, but little voltage is developed. When connected to low impedance active circuitry, this type of coupler has a relatively flat current gain over a wide frequency range.

Figure 9:
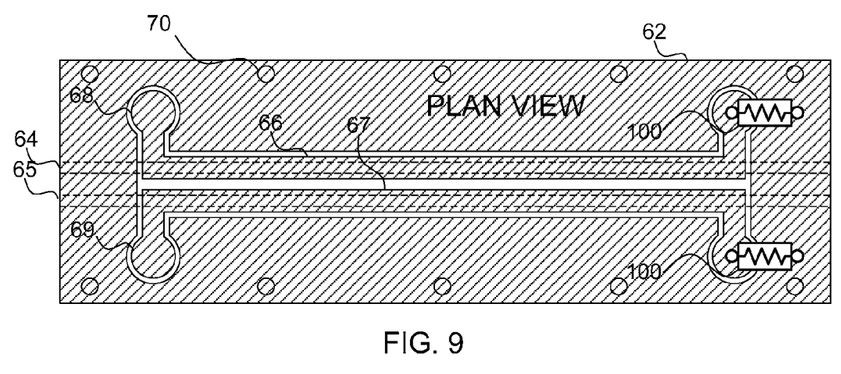
FIG. 9 shows a plan view of a coupler with resistive connections to the ground plane.

A plan view of a resistively connected coupler is shown in FIG. 9. In this structure, added resistors, 100, connect the electrodes to the ground plane. Because of the resistive connection, the signals induced on the coupler electrodes are a combination of current and voltage, so this coupler type is a hybrid of the types shown in FIGS. 7 and 8. Moreover, with suitable choice of structure dimensions and value of resistance used in the connections, 100, these couplers exhibit the desirable property of directivity even if they are substantially shorter than the quarter-wavelength used in conventional directional couplers. Conventional quarter-wavelength couplers have a constant amplitude frequency response near the corresponding quarter-wavelength frequency. These short couplers generally show greater frequency dependence in the amplitude of their response.

As described above, these types of couplers are useful in applications requiring the serial distribution of a signal to many receivers, as shown in FIG. 2. In this case, it is often desirable to maintain nearly constant signal strength at all receivers 12. However, because of signal losses inherent in the distribution transmission lines 1 and because each coupler in the chain extracts a small amount of power from the line, the signal strength in the line will decay with increased distance from the transmitter 11. These losses can be compensated by modifying the length of each coupler in the chain so that couplers near the transmitter, where the signal is strongest, are shorter, giving them less gain, and couplers at the end of the chain, where the signal is weakest, are longer, giving them more gain. With suitable adjustments to the length of the couplers, the signal strength at each receiver can be made the same.

A similar situation occurs in applications requiring the serial aggregation of many signals, as shown in FIG. 3. In this case, the signals originating furthest from the receiver 20 will suffer greatest attenuation as they travel along the distribution line 1. This attenuation can be compensated by adjusting the length of the couplers so that the gain from each transmitter 11 to the common receiver 20 is nearly equal (e.g. by making the length of the couplers farthest from the receiver longer). In this way, the aggregated signal that is received represents a nearly equal summation of all of the individual transmitted signals.

Conventional directional couplers are discrete components that are directly physically connected to the distribution lines. To insert them into a distribution line, it is necessary to break the line. So, the distribution line enters the coupler at one terminal port and emerges from another terminal port. Internal connections in the coupler provide the continuity of the electrical path between the entering and emerging lines. Because the main distribution line and the coupler are made in two distinct technological implementations, manufacturing variations will cause them to differ slightly in the transmission line characteristics, resulting in impedance discontinuities and signal reflections. These reflections may impair the circuit's function, especially in serial distribution networks where their effects may be cumulative. Integrated couplers of the type described above do not suffer from this. The composite structure consisting of two or more such couplers arranged in a serial configuration implemented in a common technology constitutes a novel structure with superior qualities compared with the conventional discrete implementation.

In the illustrated embodiments of FIGS. 7, 8, and 9, the contact or pad areas 68 and 69 are shown as being located off to the side so that they do not overly the coupler signal lines 64 and 65 on the lower layer. This was done because it was assumed that the three layers of metal described in this disclosure have other layers above these, i.e., they are part of a larger multi-layer stack. In other words, it was assumed that the two pads 68 and 69 would be buried in the middle of the stack. In that case, to make a vertical connection to them, drilled vias would need to be used. If the pads were on top of the lines, then the drill would pass through the signal lines and they would also be shorted to the via formed in the drill hole. So the pads are offset to avoid interference with the lines.

For some types of board construction this would be unnecessary. If the overlying metal layer is at the top of the stack, the concern about shorting to lower metal layers would not be an issue, in which case the contact areas could be directly above the coupler signal lines.

Also, note that for the capacitive coupler the pads 68 and 69 can be located anywhere along the length of the coupler. However, for the inductive type coupler, they need to be at the end opposite the point where they merge into the ground plane.

It is usually desirable for the couplers to be short compared with one-half wavelength in the line, but that's not a strict requirement. To keep the impedance nearly constant, a key requirement of the coupler is that it have voltage gain much less than unity. This ensures that the coupler electrodes are approximately similar to the surrounding ground planes, and don't perturb the potential distribution a lot. Longer couplers build up greater gain. At sufficiently large length, they start to behave strangely, and may exhibit undesirable resonances.

Conventional directional couplers are made of quarter-wavelength transmission line sections. Wideband couplers require a cascade of several such quarter-wave sections, so they may be quite large. For example, at 1 GHz a simple quarter-wave directional coupler would be 1.5 inches long. The intermediate-frequency couplers in a board that operates at a center frequency of 110 MHz would need to be 13.6 inches long. For comparison, these same couplers using the structure described herein are less than one inch long (with line widths and separations of 200 and 250 microns, respectively).

For PCBs a variety of well known fabrication methods may be used. Mainly, they are built up from sheets of dielectric (usually glass-reinforced resin) covered on two sides with copper foil. The dielectrics are usually a fiberglass matrix impregnated with an organic dielectric (epoxy, polyimide, lacquer, Teflon, etc). There are many proprietary resins and glass formulations. Conductor patterns are etched into the foil. Multiple layers of these sheets are aligned and stacked with intervening layers of more dielectric in an uncured state. They are pressed together and heated to laminate the multilayer structure. Then, holes are drilled and plated with metal to form the vertical layer-to-layer vias.

The technology described herein has particular applicability to multi-point signal generation networks and low cost antenna arrays such as those described in U.S. Pat. Nos. 8,259,884 and 8,611,959, respectively, the contents of which are incorporated herein in their entirety. For example, referring to FIG. 5 in that '884 patent, there is shown two tree-networks, one of which carries a first carrier signal and the second of which carries a second carrier signal. At various places the branch of one tree network runs alongside (e.g. "parallel") to a corresponding branch of the other tree network. For that pair of branches, one carries the first carrier signal in one direction and the other branch carries the second carrier signal in the other direction. Along the length of the dual parallel transmission lines, there are number of Arrival-Time-Averaging Circuits (ATACs), each with one input connect to one of the transmission lines and a second input connected to the other transmission line. The connections to the ATAC circuits can be implemented using the couplers described herein to reduce the impact that those circuits have on the signals passing over the dual transmission lines.

Other embodiments are within the following claims.

What is claimed is:

1. A signal distribution structure comprising:
a dielectric material;
an overlying conducting layer on a first level of the dielectric material, said overlying conducting layer including a window region that is surrounded on four sides by the overlying conducting layer;
a first signal line on a second level of the dielectric material under the first level, said first signal line physically separated from the overlying conducting layer by the dielectric material, said window region overlying and running parallel to a portion of the first signal line, and wherein the first signal line on each side of said portion of the first signal line passes under the overlying conducting layer;
and
a first coupler electrode on the first level of the dielectric material and located within the window region, said first coupler electrode above, parallel to, and electrically isolated by the dielectric material from the first signal line,
wherein the first coupler electrode is shorter than the first signal line and is electrically isolated from the overlying conducting layer along at least most of its periphery.

2. The signal distribution structure of claim 1, further comprising:
a second signal line on the second level of the dielectric material, said second signal line parallel to the first signal line and physically separated from the overlying conducting layer by the dielectric material, said window region overlying and running parallel to a portion of the second signal line, and wherein the second single line on each side of said portion of the second signal line passes under the overlying conducting layer;
a second coupler electrode on the first level of the dielectric material and located within the window region, said second coupler electrode above, parallel to, and electrically isolated by the dielectric material from the second signal line,
wherein the second coupler electrode is shorter than the second signal line and is electrically isolated from the overlying conducting layer along at least most of its periphery.

3. The signal distribution structure of claim 2, further comprising an underlying conducting layer on a third level of the dielectric material, wherein the second level of the dielectric material is between the first and third levels of the dielectric material.

4. The signal distribution structure of claim 3, wherein each of the first and second coupler electrodes are islands of metal physically separated from each other and physically separated from the overlying conducting layer.

5. The signal distribution structure of claim 4, further comprising a first resistive element electrically connecting one end of the first coupler electrode to the overlying conducting layer.

6. The signal distribution structure of claim 5, further comprising a second resistive element electrically connecting one end of the second coupler electrode to the overlying conducting layer.

7. The signal distribution structure of claim 2, wherein the first coupler electrode includes a contact pad area for electrically connecting to the first coupler electrode and wherein the second coupler electrode includes a contact pad area for electrically connecting to the second coupler electrode.

8. The signal distribution structure of claim 7, wherein the contact pad areas on the first and second coupler electrodes are located at one end of the first and second coupler electrodes, respectively.

9. The signal distribution structure of claim 3, wherein each of the first and second coupler electrodes physically and electrically contacts the overlying conducting layer at one end.

10. The signal distribution structure of claim 3, wherein the first and second signal lines are equidistant from the first and third levels on which the overlying and underlying conductive layers, respectively, are located.

11. The signal distribution structure of claim 3, further comprising a plurality of electrically conducting vias passing through the dielectric material and electrically connecting the overlying and underlying conducting layers together.

12. The signal distribution structure of claim 3, wherein the portion of the first signal line that is beneath the first coupler electrode is of a different width as compared to the portions of first signal line that are beneath the overlying conducting layer and the portion of the second signal line that is beneath the second coupler electrode is of a different width as compared to the portions of second signal line that are beneath the overlying conducting layer.

13. The signal distribution structure of claim 3, wherein the dielectric material and the overlying and underlying conducting layers are fabricated using printed circuit board technology.

14. The signal distribution structure of claim 3, wherein the first and second signal lines in combination with the overlying and underlying conducting layers form a shielded, differential transmission line.

15. The signal distribution structure of claim 1, wherein the first coupler electrode is an island of metal physically and electrically separated from the overlying conducting layer.

16. The signal distribution structure of claim 15, further comprising an underlying conducting layer on a third level of the dielectric material, wherein the second level of the dielectric material is between the first and third levels of the dielectric material.

17. The signal distribution structure of claim 16, further comprising a plurality of electrically conducting vias passing through the dielectric material and electrically connecting the overlying and underlying conducting layers together.

18. A signal distribution system comprising a transmission line having a sequence of coupler structures arranged sequentially along the transmission line from a first end to a second end,
wherein the transmission line comprises:
a dielectric material;
an overlying conducting layer on a first level of the dielectric material, said overlying conducting layer including a plurality of windows region, each window region of the plurality of window regions surrounded on four sides by the overlying conducting layer;
a first signal line on a second level within the dielectric material and physically separated from the overlying conducting layer by the dielectric material, each window region of the plurality of window regions overlying and running parallel to a corresponding different portion of the first signal line, and wherein the first single line on each side of each corresponding different portion of the first signal line passes under the overlying conducting layer, and
wherein each coupler structure of the sequence of coupler structures comprises:
a first coupler electrode on the first level of the dielectric material and located within a corresponding different window region, wherein said first coupler electrode is parallel to and electrically isolated by the dielectric material from the first signal line, and wherein the first coupler electrode is shorter than the first signal line and is electrically isolated from the overlying conducting layer along at least most of its periphery.

19. The signal distribution system of claim 18, wherein the transmission line further comprises a second signal line on the second level of the dielectric material, said second signal line parallel to the first signal line and physically separated from the overlying conducting layer by the dielectric material; and wherein each coupler structure of the sequence of coupler structures further comprises a second coupler electrode on the first level of the dielectric material, said second coupler electrode above, parallel to, and electrically isolated by the dielectric material from the second signal line, wherein the second coupler electrode is electrically isolated from the overlying conducting layer along at least most of its periphery.

20. The signal distribution system of claim 19, further comprising an underlying conducting layer on a third level of the dielectric material, wherein the second level of the dielectric material is between the first and third levels of the dielectric material.

21. The signal distribution system of claim 19, wherein the first and second coupler electrodes of each successive coupler structure of the plurality of coupler structures are longer than the first and second coupler electrodes of the previous coupler structure in the sequence of coupler structures.

22. The signal distribution system of claim 21, wherein within each coupler structure of the sequence of coupler structures, each of the first and second coupler electrodes are islands of metal physically separated from each other and physically separated from the overlying conducting layer.

23. The signal distribution system of claim 22, wherein each coupler structure of the sequence of coupler structures further comprises a first resistive element electrically connecting one end of the first coupler electrode of that coupler structure to the overlying conducting layer.

24. The signal distribution system of claim 23, wherein each coupler structure of the sequence of coupler structures further comprises a second resistive element electrically connecting one end of the second coupler electrode of that coupler structure to the overlying conducting layer.

25. The signal distribution system of claim 21, wherein within each coupler structure of the sequence of coupler structures each of the first and second coupler electrodes of that coupler structure physically contacts the overlying conducting layer at one end.

\* \* \* \* \*